(12) United States Patent
Brouwer et al.

(10) Patent No.: US 9,372,207 B1
(45) Date of Patent: Jun. 21, 2016

(54) POWER SENSING TRANSDUCER

(71) Applicants: Douglas Brouwer, Santa Cruz, CA (US); Jameson Brouwer, Santa Cruz, CA (US); Adam Brouwer, Santa Cruz, CA (US)

(72) Inventors: Douglas Brouwer, Santa Cruz, CA (US); Jameson Brouwer, Santa Cruz, CA (US); Adam Brouwer, Santa Cruz, CA (US)

(73) Assignee: EKM Metering, Inc., Santa Cruz, CA (US)

( * ) Notice: Subject to any disclaimer, the term of this patent is extended or adjusted under 35 U.S.C. 154(b) by 437 days.

(21) Appl. No.: 14/022,238

(22) Filed: Sep. 10, 2013

(51) Int. Cl.
  *G01R 15/18* (2006.01)
  *G01R 21/06* (2006.01)
  *H01R 4/24* (2006.01)
  *G01R 15/14* (2006.01)

(52) U.S. Cl.
  CPC ............... *G01R 15/18* (2013.01); *G01R 21/06* (2013.01); *G01R 15/142* (2013.01); *H01R 4/2404* (2013.01)

(58) Field of Classification Search
  CPC ...... G01R 15/202; G01R 1/22; G01R 15/142; G01R 19/0092; G01R 15/146; G01R 15/16; G01R 15/186; G01R 15/18; G01R 21/06; H01F 38/30; H01R 4/2433
  See application file for complete search history.

(56) References Cited

U.S. PATENT DOCUMENTS

| 4,584,525 | A | * | 4/1986 | Harnden, Jr. | ........... G01R 1/203 324/105 |
|---|---|---|---|---|---|
| 5,426,360 | A | | 6/1995 | Maraio et al. | |
| 5,562,481 | A | * | 10/1996 | Myson | ................ F21V 19/0005 439/352 |
| 5,738,436 | A | * | 4/1998 | Cummings | ............. F21S 8/026 362/148 |
| 6,097,298 | A | | 8/2000 | Brown | |
| 6,177,884 | B1 | | 1/2001 | Hunt et al. | |
| 6,415,244 | B1 | | 7/2002 | Dickens et al. | |
| 6,522,123 | B2 | | 2/2003 | Ribes | |
| 6,544,068 | B1 | * | 4/2003 | Hatton | .................. F21V 21/002 429/209 |
| 6,555,999 | B1 | | 4/2003 | Lindsey et al. | |
| 6,677,743 | B1 | | 1/2004 | Coolidge et al. | |
| 6,756,776 | B2 | | 6/2004 | Perkinson et al. | |
| 6,825,650 | B1 | | 11/2004 | McCormack et al. | |
| 7,164,263 | B2 | | 1/2007 | Yakymyshyn et al. | |
| 7,312,686 | B2 | | 12/2007 | Bruno | |
| 7,557,563 | B2 | | 7/2009 | Gunn et al. | |
| 7,714,566 | B2 | | 5/2010 | Perez | |
| 7,719,257 | B2 | | 5/2010 | Robarge et al. | |
| 7,746,055 | B2 | | 6/2010 | Bose et al. | |
| 8,143,882 | B2 | | 3/2012 | Yang | |
| 8,193,803 | B2 | | 6/2012 | Bose et al. | |
| 2006/0172586 | A1 | * | 8/2006 | Rosenblatt | ........... H01R 4/2404 439/425 |
| 2008/0077336 | A1 | * | 3/2008 | Fernandes | ............ G01R 15/142 702/57 |
| 2014/0143578 | A1 | * | 5/2014 | Cenizal | ................... H02J 13/00 713/340 |

* cited by examiner

*Primary Examiner* — Michael Zarroli
(74) *Attorney, Agent, or Firm* — File-EE-Patents.com; Jay Chesavage

(57) ABSTRACT

A current measurement and voltage measurement transducer for power measurements has an upper split core attached to an upper housing and a lower split core attached to a lower housing. The upper housing and lower housing have a common hinge surface and engaging surfaces for maintaining closure and providing a magnetic circuit which surrounds a conductor placed inside the transducer, and the magnetic circuit is coupled to windings around the split core, thereby providing a measurement of current. The housings also provide one or more piercing pins which penetrate the insulation of the conductor and provide a voltage measurement.

19 Claims, 6 Drawing Sheets

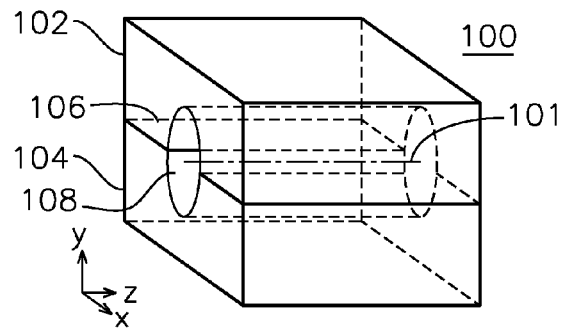
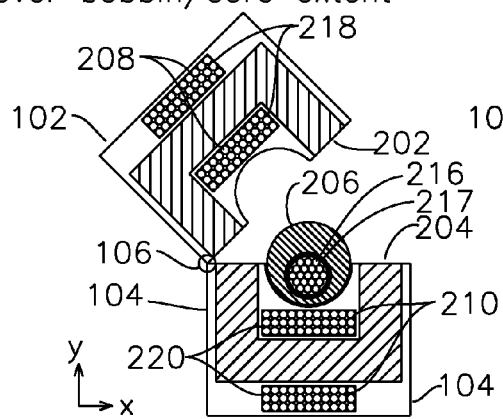
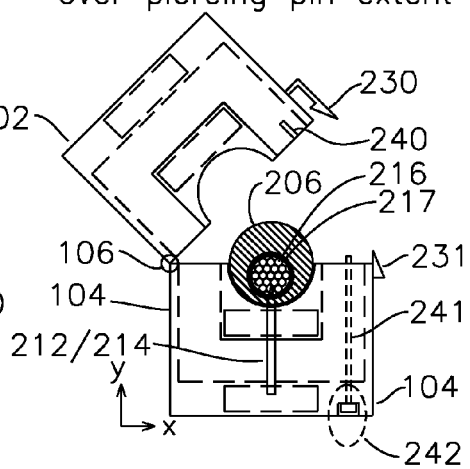
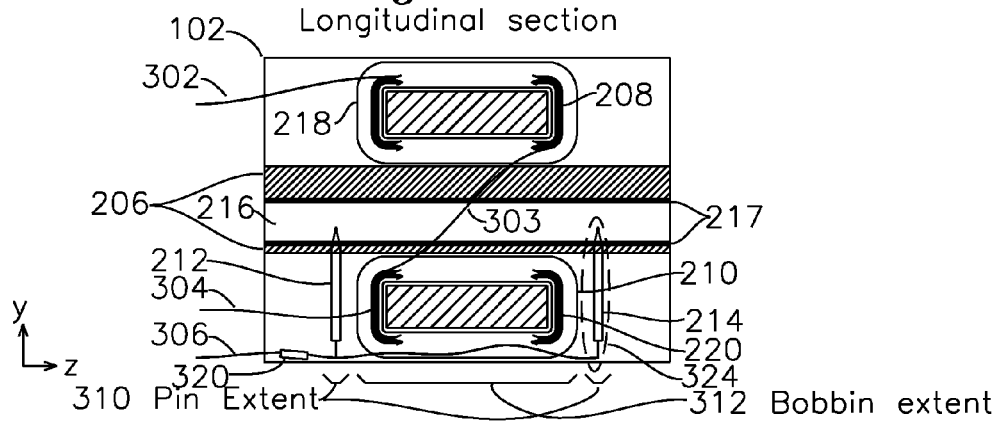

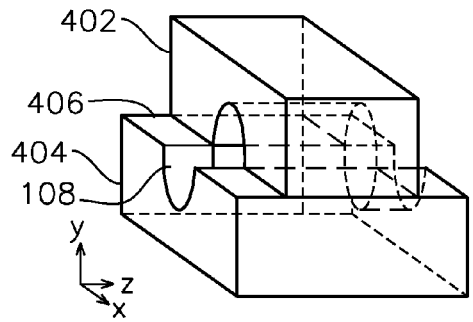
*Figure 4*
Clamshell Wire Housing
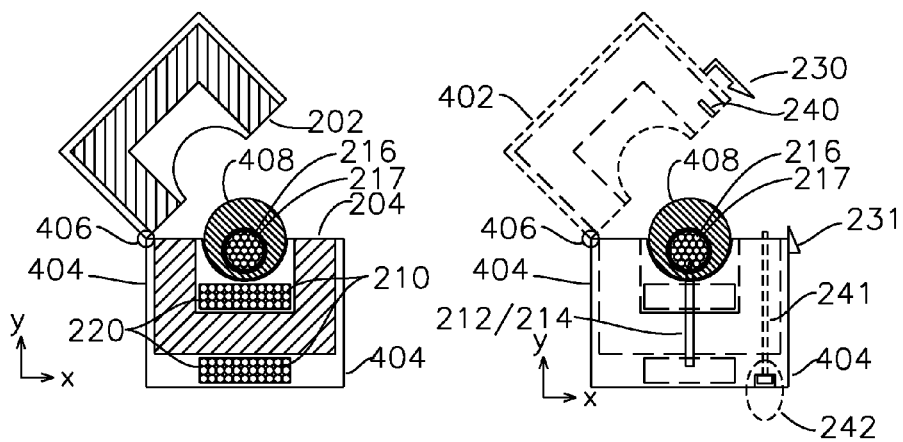
*Figure 5A*
Split Core Transformer Shell
(bobbin/core extent)
*Figure 5B*
Split Core Transformer Shell
(pin conductor extent)
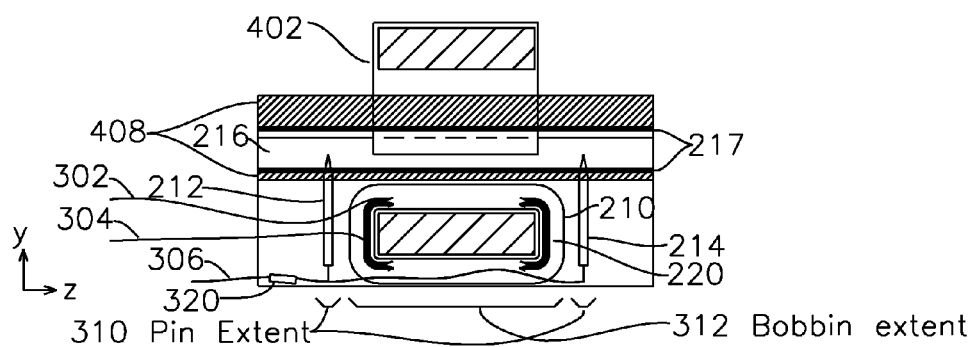
*Figure 6*
Longitudinal section Locking Fastener Detail Screw piercing pin detail Stationary Piercing Pin Detail eccentric support, small diameter wire eccentric support, medium diameter wire eccentric support, large diameter wire

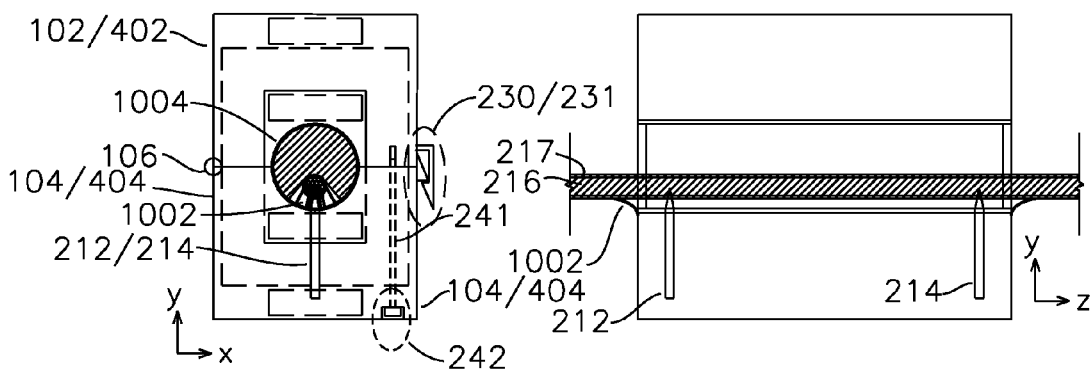
*Figure 10A*
eccentric slotted support
*Figure 10B*
eccentric slotted support
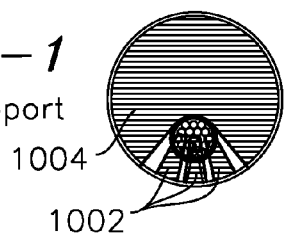
*Figure 10A-1*
eccentric slotted support
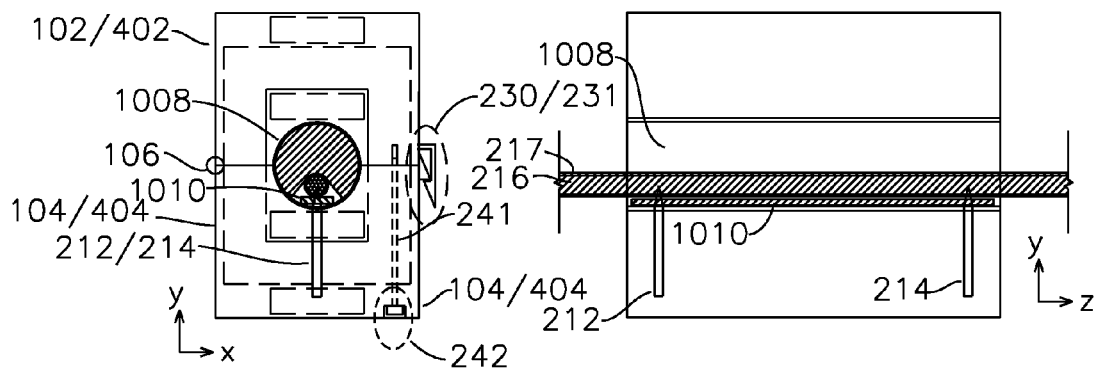
*Figure 10C*
slotted support with shim
*Figure 10D*
slotted support with shim support w/breakaway tabs support w/breakaway tabs breakaway support breakaway support slotted support with pin sleeve slotted support with pin sleeve

POWER SENSING TRANSDUCER

FIELD OF THE INVENTION

The present invention relates to a power sensing transducer. More particularly, the invention is directed to a device for clamp-on simultaneous measurement of voltage and current in an enclosed conductor.

BACKGROUND OF THE INVENTION

Measurement of voltage and current for estimation of power is a fundamental problem of power sensing. One prior art device uses a split-core transformer which momentarily opens to enclose a single conductor, which causes a magnetic flux to be developed in the split-core transformer. Making a magnetic flux measurement using the split core transformer, it is thereby possible to estimate the current flowing through the conductor enclosed by the split-core transformer. A voltage measurement may be combined with the current measurement to form a power measurement, such as by multiplying the current and voltage and computing a root mean square (RMS) value to generate the RMS power estimate.

OBJECTS OF THE INVENTION

A first object of the invention is a power measurement transducer having a split core transformer positioned along an axial extent of a eccentric channel for enclosing a conductor, the eccentric channel also having a first piercing pin in a first piercing pin extent and a second piercing pin in a second piercing pin extent, the first channel extent and second channel extent located on opposite sides of the split core transformer and on the conductor axis, the eccentric channel positioning a range of conductor diameters such that the conductor is an insulation piercing distance from the piercing pin.

A second object of the invention is a power sensing transformer having a split core transformer positioned along an axial extent for accommodating a current carrying conductor, the axial extent providing a eccentric channel for the conductor, the eccentric channel including at least one piercing pin which is in a different channel extent than the split core transformer, the split core transformers having windings coupled to a current measurement device.

SUMMARY OF THE INVENTION

A current measuring transformer for measurement of a voltage and a current in a conductor includes an eccentric channel which is surrounded by a split core transformer which couples magnetic flux generated by the conductor to windings around the split core transformer, the split core transformer having a hinge and closure for application and removal of the power sensing transducer from the conductor, the eccentric channel positioning the conductor to within a pin piercing distance from at least one piercing pin for making electrical contact with the conductor positioned by the eccentric channel.

BRIEF DESCRIPTION OF THE DRAWINGS

FIG. 1 is perspective view of a clamshell wire housing.
FIG. 2A is an axial cross section view of the power transducer perpendicular to the channel axis and through the transformer core and bobbin.
FIG. 2B is an axial cross section view of the power transducer perpendicular to the channel axis and through the piercing pin extent.
FIG. 3 is a transverse section view of the power transducer through the channel axis.
FIG. 4 is the perspective view of another embodiment of a clamshell wire housing.
FIG. 5A is an axial cross section view of a power transducer through the channel axis of the transformer core and bobbin extent.
FIG. 5B is an axial cross section view of a power transducer through the channel axis of the piercing pin extent.
FIG. 6 is a transverse section view of the power transducer of FIGS. 4, 5A, and 4B through the channel axis showing the transformer core, bobbin, and piercing pins.
FIGS. 10A, 10B, 10A-1, 10C, 10D, 10E, 10F, 10G, 10H, 10I, and 10J show projected section view of alternative eccentric supports and electrical isolation of the piercing pins.

DETAILED DESCRIPTION OF THE INVENTION

Figure 7:
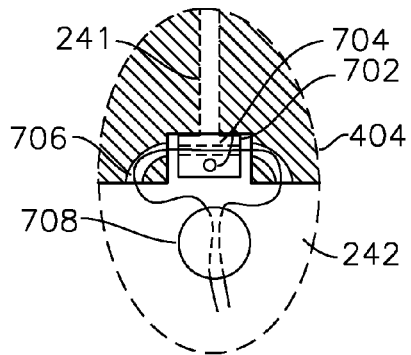
FIG. 7 is a detail view of a locking fastener of FIG. 2B or 5B.

FIG. 1 shows a clamshell conductor housing 100 having a channel axis 101, an upper housing 102, lower housing 104, conductor channel aperture 108, and a hinge line 106 which allows the upper housing 102 to hinge open from lower housing 104 and allow a conductor (not shown) to be placed about the channel axis 101.

FIG. 2A shows a cross section view of a split core transformer upper pole piece 202 in the xy plane, showing the pole piece 202 is enclosed on five sides by upper housing 102. Upper pole piece 202 has windings 208 which are wound around the magnetic path of the pole piece, typically using a bobbin 218 or other support for the wire windings 208. Similarly, lower housing 104 encloses lower split core transformer pole piece 204 on five sides, the pole piece having windings 220 supported by bobbin 210. When closed, the housings 102 and 104 place the upper pole piece 202 and lower pole piece 204 faces in contact with each other and close a magnetic circuit formed by the upper pole piece 202 and lower pole piece 204, thereby forming the magnetic circuit for coupling flux generated by enclosed conductor 216 to windings 208 and 210. The enclosed conductor 216 may be carrying an electric current as either alternating current (AC) or direct current (DC), although the invention is directed to AC measurements. Upper pole piece 202 and lower pole piece 204 are fabricated from a material having a high permittivity ($\mu$) relative to the unity permittivity of air, such as any ferromagnetic material including iron, iron powder, ferrites or other powdered iron mixtures, or laminated iron, such that the pole pieces 202 and 204 concentrate magnetic flux from conductor 216, and couple the magnetic flux to windings 208 and 220, thereby producing a scaled current in windings 208 and 220 which is substantially equal to the current to be measured in conductor 216 divided by the number of turns n in windings 108 and 210. The windings 208 and 220 may thereby be coupled to an amplifier for conversion to an estimate of current flowing in conductor 216. Central conductor 216 carrying the current to be measured is typically formed from a high electrical conductivity metal such as copper or aluminum, which is encased with an outer insulation material 217 having a high melting point, such as polyvinylchloride (PVC).

The clamshell conductor housing 100 has a z axis extent which includes a central bobbin and core extent as described in FIG. 2A and a piercing pin extent shown in FIG. 2B (also in the xy plane) and which is on either side of central bobbin extent of FIG. 2A, corresponding to each piercing pin 212 and 214, respectively. The conductor 216 and insulator 217 are supported by eccentric support 206 which offsets the conductor 216 and insulator 217 axis nearer to a lower piercing region of the conductor 216 in the x-z plane, to allow the insulation 217 to be penetrated by piercing pins 212 and 214 which are positioned in a piercing pin extent of the z axis as shown in FIG. 2B, which is beyond the z extent of the cores 204 and 202, bobbins 218 and 210, and windings 208 and 220. In one embodiment of the invention, eccentric support 206 may be split in the zx plane such that it similarly has a hinge line on an outer surface which is parallel to the z axis, and in another embodiment of the invention, support 206 may be formed as a single piece. The outer surface of support 206 may be formed from a cylindrical form for engagement with housing channel 108. When support 206 is formed as a single piece, it is threaded over the outer insulator 217 of a conductor prior to installation of the support 206 (with the captured conductor) in channel aperture 108. The eccentric support 206 may be formed by having the inner cylindrical aperture axis displaced from the center axis of the cylindrical solid, thereby providing preferential engagement of the supported conductor 216 with piercing pins 212 and 214.

FIG. 3 shows a perpendicular view on the longitudinal axis z of FIGS. 2A and 2B in the yz plane. Eccentric support 206 has a z extent which includes pin extents 310 corresponding to piercing pins 212 and 214, and optionally includes the bobbin extent 312, with an offset in y towards the piercing pins 212 and 214. When the upper housing 102 and lower housing 104 are snapped closed and secured with mating closure engagements 230 and 231 of FIG. 2B, upper split core pole piece 202 and lower split core pole piece 204 are in substantial contact with each other, and piercing pins 212 and 214 penetrate insulation 217 and are in electrical contact with conductors 216. Upper bobbin 218 winding 208 may be placed in series with lower bobbin 210 winding 220 such that leads 302 and 304 are brought out which provide a flux measurement which can easily be converted to a current estimate using the n total bobbin windings to multiply n by the measured current in windings 210 and 220, and lead 206 is electrically connected to both piercing pins 212 and 214 provide a reliable electrical contact for voltage measurement. The current, voltage, RMS power, power factor, and other basic AC parameters may be thereby measured related to current and voltage flowing through conductor 216. The piercing pins 212 and 214 typically have a piercing point profile which is selected to minimally spreading the insulation 217 radially at the contact point upon insertion, and the plasticity of the insulation typically causes the insulation 217 to close around the penetrating aperture when the piercing pins 212 and 214 are withdrawn. For insulators with non-plastic properties, electrical tape may be used to cover the small inclusion in the insulation which remains after the conductor is removed and the piercing pins are no longer in contact with insulation 217 which encloses conductor 216.

FIGS. 4, 5A, 5B, and 6 may be examined in combination, and show another embodiment of the clamshell wire housing where upper housing 402 has a z-axis extent which is less than the lower housing 406 z extent and hinge 406 which may be formed such as by molding this feature into a single housing which forms upper housing 402 and lower housing 404, as can also be done in FIGS. 1 102 and 104, respectively. FIGS. 5A and 5B show the similar arrangement of elements upper pole piece 202 and lower pole piece 204. In one embodiment shown in FIGS. 5A, 5B, and 6, single bobbin 210 with windings 220 may be used with lower pole piece 404, with upper pole piece 202 having no windings, but serving only to complete the magnetic circuit when housings 402 and 404 are closed and secured by closure engagements 230 and 231. The single-coil embodiment of FIGS. 5A, 5B, and 6 may also be used with the embodiment of FIGS. 2A, 2B, and 3, or with the housing shown in FIG. 1.

Housing 104 of FIG. 2B and 404 of FIG. 5B have in one embodiment interlocking closure engagements 230 and 231 to ensure the required gap closure on the upper and lower pole pieces 202 and 204, respectively. The interlocking closure engagements 230 and 231 may be placed in each of the pin extents 310, or as a single region in bobbin extent 312, or any combination of the pin extents 310 and bobbin extents 312. In another embodiment of the invention which may be practiced separately or with closure engagements 230 and 231, a countersunk screw 241 which is disposed in a recess in lower housing 104 or 404 engages with a threaded engagement 240 which is part of the upper housing 102 or 402 as shown in FIGS. 2B and 5B, respectively.

In certain uses, such as utility customer power metering, it may be desired to provide a tamper evident seal on the power sensing transducer assembly. FIG. 7 shows detail region 242 of FIG. 2B or 5B, including, in one embodiment of the invention, a tamper-evident security lead 706 such as a wire or cable which may be threaded through apertures 704 formed into the head of screw fastener 241 and which are gathered together in seal 708, which may be formed from metal, plastic, or any other tamper evident material.

Figure 8A:
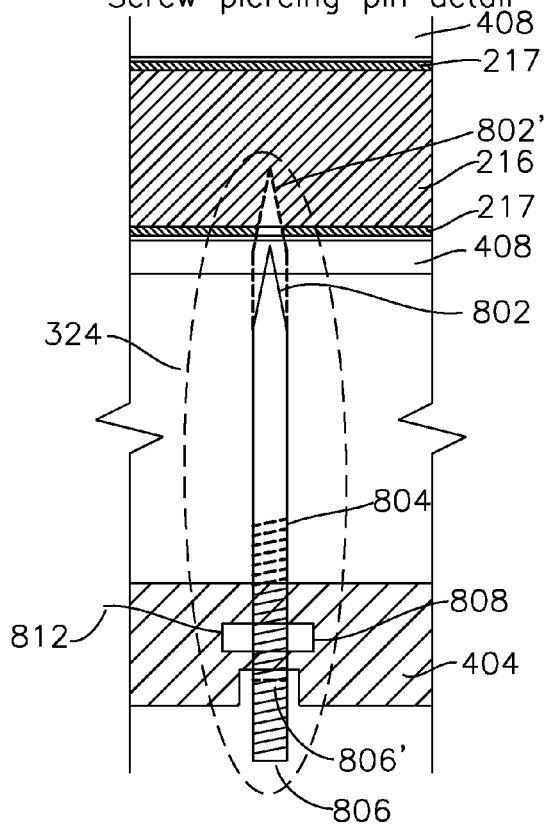
FIGS. 8A and 8B are detail views of piercing pin embodiments.
Figure 8B:
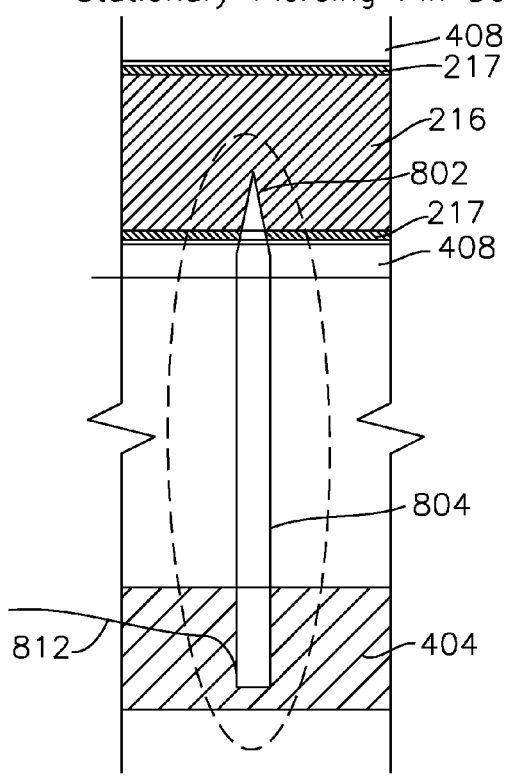

FIGS. 8A and 8B shows embodiments for the piercing pin region 324 of FIG. 3 or 5. FIG. 8A shows an embodiment for a threaded piercing pin 804 engaged with threaded nut or bushing 808, where the piercing pin has a sharp piercing end 802 formed into a conical taper with a screw head or other engagement surface formed into actuation end 806. When the actuation end 806 is rotated, such by using a screwdriver engaged with a slot in actuation end 806, threads formed in shaft 804 engage with threaded nut 808 and advance the conical taper 802 through the insulation 217 and into the conductors 216. Nut 808 is also electrically connected to lead 812 which is connected to the input of fuse 320 of FIGS. 3 and 6. FIG. 8B shows another embodiment where the piercing pin 802 is stationary, such as by attachment to housing 404, and the closure of the housing 102 and 104 (or 402 and 404) results in the piercing pin 802 being forced through the insulation 217 and making contact with conductors 216. Although the examples of FIGS. 3 and 6 show piercing pins 212/214 oriented in the y axis and secured by the lower housing 104 or 404, piercing pins 212/214 may be oriented for actuation from any surface of the enclosures of FIG. 1 or 4 which provide piercing access to conductor 216.

Figure 9A:
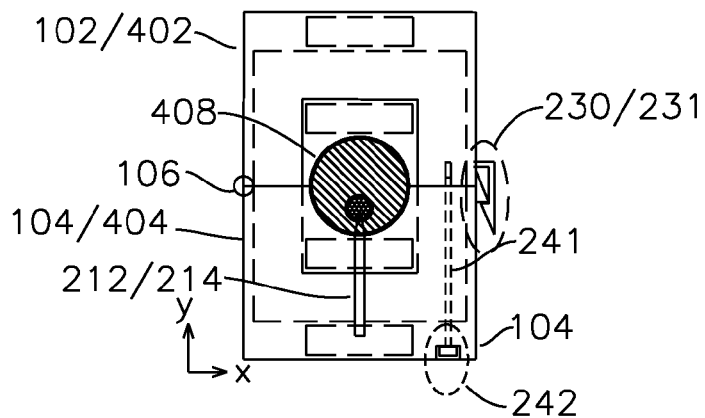
FIGS. 9A, 9B, and 9C shows the cross section view of various eccentric supports which provide electrical continuity to a piercing pin into a conductor for a range of different conductor sizes.
Figure 9B:
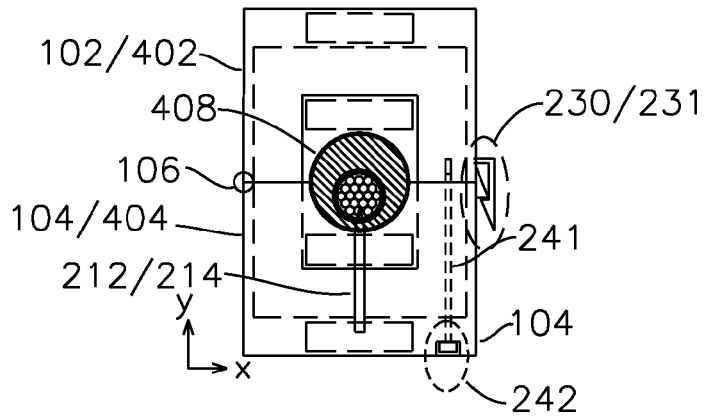
Figure 9C:
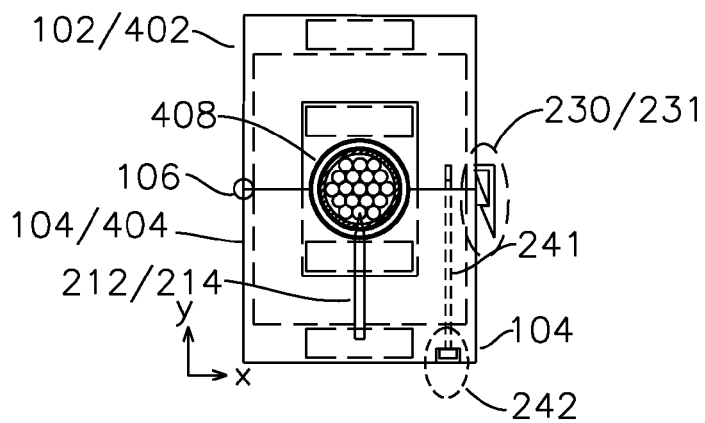

The eccentric conductor support 206 of FIGS. 2A and 2B, and 408 of FIGS. 5A and 5B is shown in FIG. 9A in various example embodiments. The outer diameter of eccentric conductor support 408 matches the diameter of, and engages with, the upper enclosure 102/402 and lower enclosure 104/404 of FIGS. 2A, 2B, 5A, and 5B. The eccentric support 406 inner diameter can be specific to the conductor size in use, as shown in FIGS. 9A, 9B, and 9C for different conductor sizes, with the eccentric offset arranged to place the conductor an insulation diameter away from the lower housing surface and piercing pins 212 and 214, thereby allowing the same piercing pin configuration and piercing pin adjustment range to be used for a wide variety of conductor sizes and insulation thicknesses. The eccentric conductor support 408 may be fabricated as a single separate piece, or as separate halves which are secured together by circumferential force applied by upper/lower housing halves 102/104 or 402/404 when closed, or support 408 may be formed as a hinged cylindrical piece with a hinge axis oriented parallel to the Z axis. Alternatively, the eccentric support may be formed into, and integrated with, the housing 102/104 or 402/404.

The power sensing transformer shown in FIG. 3 provides current transformer leads 302 and 304, and voltage sensing lead 306. If the current transformer leads 302 and 304 are not terminated into a sufficiently low impedance, the voltage developed at the winding leads 302 and 304 may become large, leading to undesirable insulation breakdown and voltage arcing in the windings. This breakdown may be prevented through the use of snubber diodes or other voltage clamping devices which do not present to the circuit for low level measurement voltages, but provide a low impedance for higher voltages. Examples of voltage clamping devices include zener diodes, transzorb diodes, and positive temperature coefficient (PTC) resistors. It is generally desirable for these protective devices to have bidirectional characteristics when applied across windings 208 and 220 to prevent the generation of harmful amplitudes of positive or negative voltages.

Figure 10E:
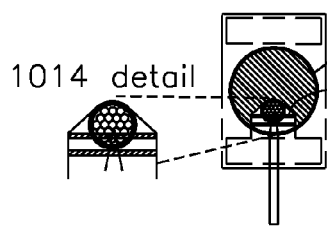

Additional embodiments for the eccentric wire support and associated elements of the invention are shown in FIGS. 10A, 10B, 10A-1, 10C, 10D, 10E, 10F, 10G, 10H, 10I, and 10J. FIG. 10A shows a projected axial (xy plane) view of a slotted support 1004 which includes a piercing pin barrier in the form of elongate insulated fingers 1002 which may be formed into support 1004, or the piercing pin barrier may be formed with lower housing 104/404, or the piercing pin barrier may be provided as a bushing which is placed around or over conductor 216 and insulation 217 to isolate piercing pins 214/212 from inadvertent user or equipment contact. Alternatively, deformable tape (not shown) may be wrapped over conductor 216 insulation 217 to create a deformable region which insulates any exposed or accessible part of piercing pins 212/214. FIG. 10B shows trans-axial (yz plane) view of FIG. 10A showing elongate insulated fingers 1002 with respect to previously described structures. When eccentric support 1004 is slotted on the bottom-facing surface as shown, elongate insulated fingers 1002 need only be present in the slotted area, although they may alternatively surround the entire wire, if desired. FIG. 10A-1 shows a magnified view of the slotted support 1004 and elongate insulated fingers 1002.

FIG. 10C shows a projected axial section view of slotted support 1008, which, as with support 1004 of FIG. 10A, includes a slotted region to provide mechanical backing for the piercing pins 212/214 during and after penetration of the wire insulation 217. Shim 1010 is made from an insulating material and has apertures for passage of piercing pins 212/214, which also locates the shim 1010. As with the elongate fingers 1002 previously described, shim 1010 isolates a user or other adjacent equipment from accidental contact with piercing pins 212/214, thereby isolating the piercing pins from user or equipment contact. FIG. 10D shows a section view in the trans-axial plane indicating the relative positions of conductor 216 with insulation 217, shim 1010, and slotted support 1008. Slotted support 1008 may be solid, formed with periodic support walls along the z-axis to provide backing for piercing pins 212/214, or it may be formed with a shell wall thickness for engagement with upper and lower supports 102/402 and 104/404.

Figure 10F:
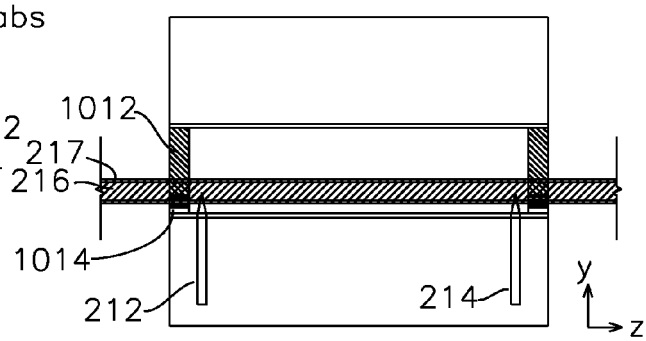

FIG. 10F shows an eccentric support 1012 in a trans-axial view, which may be a slotted support shown in previous figures, including horizontal breakaway tabs 1014 isolating the piercing pins as shown in FIG. 10E 1014 detail. The tabs 1014 may be individually broken away for a particular size wire, and the breakaway tabs 1014 may be arranged above or below the conductor 216 and insulation 217. FIG. 10F shows a trans-axial section view with the eccentric support 1012 and breakaway tabs 1014 positioned in regions adjacent to piercing pins 212 and 214.

Figure 10G:
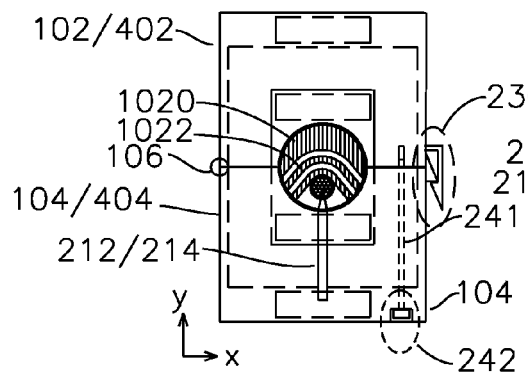
Figure 10H:
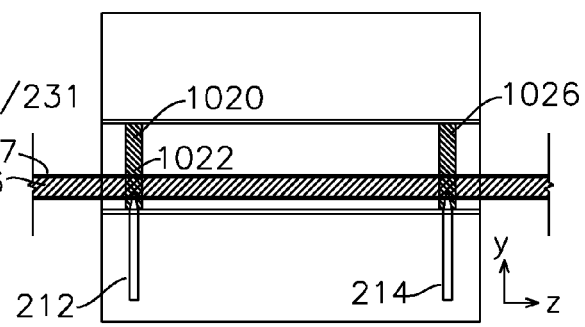

FIG. 10G shows another embodiment of the eccentric support 1020 with breakaway regions 1022, where each breakaway tab has a radius which matches a particular radius of the outer insulation 217 of conductor 216. The breakaway tabs may be located adjacent to piercing pins 212/214 isolating them from equipment or user contact, or in the same plane as shown in FIG. 10H.

Figure 10I:
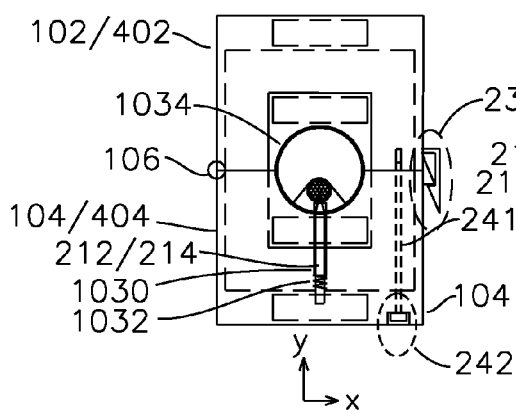
Figure 10J:
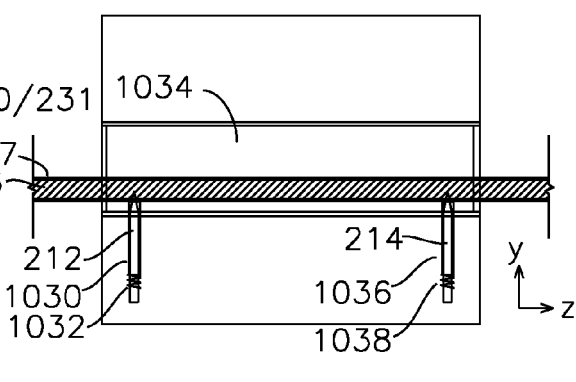

FIG. 10I show a slotted support 1034 with piercing pins 212/214 insulated by retractable insulating sleeve 1030 which slides into contact with insulation 217 of conductor 216, with the contact force generated by associated springs 1032. FIG. 10J shows the projected view in the trans-axial plane which includes piercing pins 212 and 214, with respective insulating sleeves 1030 and 1036, and springs 1032 and 1038 which isolate the piercing pins 212 and 214 from user or equipment contact.

The examples set forth are only to aid in the understanding of the invention, and are not intended to limit the scope of the invention to only the embodiments described herein. Therefore, each of the aspects and embodiments of the invention may be practiced with other aspects and embodiments of the invention without loss of generality. The scope and breadth of the invention is understood by the claims which follow.

We claim:

1. A power measurement transducer for a conductor having a current and a voltage to be measured, the measurement transducer comprising:
    a lower housing enclosing a lower pole piece;
    an upper housing enclosing an upper pole piece, said upper pole piece and said lower pole piece enclosing a conductor to be measured, said upper pole piece and said lower pole piece having faces which are in contact with each other when closed, said lower pole piece and said upper pole piece thereby forming a magnetic circuit when in contact with each other;
    a winding coupled to said magnetic circuit;
    an eccentric conductor support for positioning a conductor enclosed by said lower pole piece and said upper pole piece to within a piercing region of the eccentric conductor support;
    at least one piercing pin positioned beyond a conductor axial extent of said lower pole piece or said upper pole piece, said piercing pin positioned to penetrate through an aperture in said eccentric conductor support proximal to said piercing region and into an enclosed conductor supported by said eccentric conductor support;
    where said piercing pin is adjustable and includes threads which engage with matching threads coupled to either said lower housing or said upper housing.

2. The power measurement transducer of claim 1 where said winding is a single winding placed on either said upper pole piece or said lower pole piece.

3. The power measurement transducer of claim 1 where said winding is a first winding placed on said upper pole piece and in series with a second winding placed on said lower pole piece.

4. The power measurement transducer of claim 2 where said winding is a wire wound around a bobbin.

5. The power measurement transducer of claim 3 where each said first winding and said second winding are formed by a wire wound around a bobbin.

6. The power measurement transducer of claim 1 where said piercing pin is fixed to either said lower housing or said upper housing and said eccentric support proximal to said piercing region causes said piercing pin to come into electrical contact with an enclosed conductor upon closure of said upper housing with said lower housing.

7. The power measurement transducer of claim 1 where said piercing pin includes a first piercing pin and a second piercing pin which are substantially perpendicular to the axis of an enclosed conductor, and said piercing pins are positioned on opposite sides of said pole pieces and along the axis of an enclosed conductor.

8. The power measurement conductor of claim 5 where said piercing pin is coupled to a fuse input, said fuse having an output coupled to a voltage measurement wire.

9. The power measurement transducer of claim 1 where said upper housing and said lower housing are formed from a single piece of material having a common line of intersection which forms a hinging region.

10. The power measurement transducer of claim 1 where said eccentric conductor support has a cylindrical inner aperture formed inside a cylindrical solid, the cylindrical inner aperture having an axis which is parallel to, but offset from, the axis of said cylindrical solid.

11. The power measurement transducer of claim 1 where said upper housing and said lower housing include a fastener for maintaining said first pole piece face in contact with said second pole piece face after closure of said upper housing to said lower housing.

12. The power measurement transducer of claim 11 where said fastener is a screw passing through an aperture in either said upper housing or said lower housing and engaging with threads in either said lower housing or said upper housing.

13. The power measurement transducer of claim 11 where said fastener includes an aperture which can be aligned with an adjacent aperture in said upper housing or said lower housing.

14. The power measurement transducer of claim 13 where said fastener aperture and said housing aperture are located to allow the application of a wire or cable through the fastener aperture and housing aperture, said wire or cable secured by a tamper evident seal.

15. The power measurement transducer of claim 1 where said eccentric support includes a barrier which electrically isolates said piercing pin.

16. The power measurement transducer of claim 15 where said barrier includes at least one of: insulated breakaway tabs on an aperture side of said piercing pin, elongate insulated fingers on an aperture side of said piercing pin, insulated sleeves which cover the piercing pin, or a shim with apertures that said piercing pin passes through.

17. A process for performing a power measurement on a conductor, the process having:
   a wire enclosure step whereby a first pole piece in a first housing and a second pole piece in a second housing are secured to surround the conductor, the first and second housings sharing a hinge surface and closure engagement for maintaining a magnetic circuit formed by said first pole piece and said second pole piece having faces in substantial contact with each other;
   a current measuring step whereby a current is measured from a winding which is coupled to said magnetic circuit;
   a voltage measuring step whereby said first housing or said second housing further comprises at least one piercing pin which is located along the axis of a conductor and beyond the extent of said first pole piece and said second pole piece, the piercing pin passing through an eccentric support which is located between the wire and an aperture formed by the first housing and second housing, the eccentric support offsetting the conductor from the axial center of the housing aperture and closer to the piercing pin, the voltage measured from the piercing pin after contact with the conductor.

18. The process of claim 17 where said piercing pin has sufficient length to penetrate an insulator surrounding said conductor.

19. A power measurement transducer for a conductor having a current and a voltage to be measured, the measurement transducer comprising:
   a lower housing enclosing a lower pole piece;
   an upper housing enclosing an upper pole piece, said upper pole piece and said lower pole piece enclosing a conductor to be measured, said upper pole piece and said lower pole piece having faces which are in contact with each other when closed, said lower pole piece and said upper pole piece thereby forming a magnetic circuit;
   a winding coupled to said magnetic circuit;
   an eccentric conductor support for positioning a conductor enclosed by said lower pole piece and said upper pole piece to within a piercing region of the eccentric conductor support;
   at least one piercing pin positioned beyond a conductor axial extent of said lower pole piece or said upper pole piece, said at least one piercing pin positioned to penetrate through an aperture in said eccentric conductor support proximal to said piercing region and into an enclosed conductor supported by said eccentric conductor support;
   where said winding is a wire wound around a bobbin.

* * * * *